United States Patent
Borchers

(10) Patent No.: US 12,044,701 B2
(45) Date of Patent: Jul. 23, 2024

(54) VERTICAL CONVOLUTE METAL BELLOWS FOR ROTARY MOTION, VACUUM SEALING, AND PRESSURE SEALING

(71) Applicant: KLA Corporation, Milpitas, CA (US)

(72) Inventor: Bruce Borchers, Scotts Valley, CA (US)

(73) Assignee: KLA Corporation, Milpitas, CA (US)

( * ) Notice: Subject to any disclaimer, the term of this patent is extended or adjusted under 35 U.S.C. 154(b) by 382 days.

(21) Appl. No.: 17/568,057

(22) Filed: Jan. 4, 2022

(65) Prior Publication Data

US 2022/0268808 A1 Aug. 25, 2022

Related U.S. Application Data

(60) Provisional application No. 63/151,800, filed on Feb. 22, 2021.

(51) Int. Cl.
*G01R 1/04* (2006.01)
*G01R 31/26* (2020.01)
(Continued)

(52) U.S. Cl.
CPC ........... *G01R 1/04* (2013.01); *G01R 31/2601* (2013.01); *G01R 31/2656* (2013.01); *H01L 21/67276* (2013.01)

(58) Field of Classification Search
CPC .. G01R 1/04; G01R 31/2601; G01R 31/2656; H01L 21/67276; H01L 21/68785;
(Continued)

(56) References Cited

U.S. PATENT DOCUMENTS

| 6,852,035 B2 * | 2/2005 | Tsugane | B23K 9/32 |
| | | | 92/45 |
| 2006/0204826 A1 * | 9/2006 | Borchers | H01M 8/2483 |
| | | | 429/444 |

(Continued)

FOREIGN PATENT DOCUMENTS

| CN | 210362588 U | 4/2020 |
| CN | 210600185 U | 5/2020 |

(Continued)

OTHER PUBLICATIONS

WIPO, ISR for International Application No. PCT/US2022/015718, May 26, 2022.

*Primary Examiner* — David A Vanore
(74) *Attorney, Agent, or Firm* — Hodgson Russ LLP

(57) ABSTRACT

A system and method for rotary motion with vacuum sealing is provided. The system includes a vacuum chamber, a component mount disposed in the vacuum chamber, and a base. A bellows is disposed between the base and the component mount, and the bellows provides a seal between the base and the component mount. The bellows, the base, and the component mount define an actuator compartment therebetween. An actuator is disposed in the actuator compartment. The actuator is configured to rotate the component mount relative to the base in order to align a component disposed on the component mount. Rotation of the component mount relative to the base causes torsional elastic deformation of the bellows.

20 Claims, 5 Drawing Sheets

(51) Int. Cl.
    *G01R 31/265*     (2006.01)
    *H01L 21/67*     (2006.01)

(58) Field of Classification Search
    CPC ..... H01L 21/68792; C25D 3/562; C25D 1/20;
                   C25D 1/02; C22C 19/03; G03F 1/84
    See application file for complete search history.

(56) References Cited

U.S. PATENT DOCUMENTS

| | | | | |
|---|---|---|---|---|
| 2007/0013385 | A1* | 1/2007 | Taylor | G01R 31/2891 |
| | | | | 16/300 |
| 2010/0020377 | A1* | 1/2010 | Borchers | H04N 9/3129 |
| | | | | 359/216.1 |
| 2010/0208322 | A1* | 8/2010 | Borchers | G02B 26/085 |
| | | | | 359/223.1 |
| 2013/0020981 | A1* | 1/2013 | Borchers | H02K 41/0354 |
| | | | | 318/652 |
| 2013/0088101 | A1* | 4/2013 | Borchers | B29C 45/14467 |
| | | | | 264/261 |
| 2015/0321360 | A1* | 11/2015 | Galipienzo Huguet | B25J 1/08 |
| | | | | 74/490.06 |
| 2018/0087180 | A1* | 3/2018 | Wang | C30B 29/06 |
| 2021/0048756 | A1* | 2/2021 | Marks | G03F 7/70841 |
| 2022/0346212 | A1* | 10/2022 | Flachenecker | H01J 35/16 |
| 2023/0135447 | A1* | 5/2023 | Flachenecker | H01J 35/18 |
| | | | | 378/113 |

FOREIGN PATENT DOCUMENTS

| | | | |
|---|---|---|---|
| CN | 112129807 | A | 12/2020 |
| KR | 101608916 | B1 | 4/2016 |

* cited by examiner

VERTICAL CONVOLUTE METAL BELLOWS FOR ROTARY MOTION, VACUUM SEALING, AND PRESSURE SEALING

CROSS-REFERENCE TO RELATED APPLICATIONS

This application claims priority to the provisional patent application filed Feb. 22, 2021 and assigned U.S. App. No. 63/151,800, the disclosure of which is hereby incorporated by reference.

FIELD OF THE DISCLOSURE

This disclosure relates to optical equipment for semiconductor inspection or metrology.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etch, deposition, and ion implantation. An arrangement of multiple semiconductor devices fabricated on a single semiconductor wafer may be separated into individual semiconductor devices.

The continued shrinking of design geometries in integrated circuit devices generates a continual need for improved optical inspection and metrology tools. For example, light sources for photolithography systems have historically evolved to smaller and smaller wavelengths, thereby allowing the construction of smaller and smaller structures. For instance, the use of visible wavelength light (e.g., 400 nm) gave way to near ultraviolet light (e.g., 300 nm), which then gave way to deep ultraviolet (DUV) light (e.g., 200 nm). Then, more recently, DUV light sources have given way to extreme ultraviolet (EUV) sources (e.g., 13.5 nm).

With feature sizes in semiconductor technologies getting increasingly smaller, the wavelength of light has become a limiting factor in optical processes used in semiconductor processes, including lithography and wafer and mask inspection and metrology. Advanced optical technologies use EUV light (for example, wavelengths in the range of 11 nm to 15 nm and more specifically wavelengths of 13.5 nm) to address issues resulting from increasingly smaller features sizes, and a bright EUV light source free of debris is invaluable in the pursuit of next generation semiconductor processes. One challenging aspect of developing a bright EUV light source is to mitigate debris from the plasma generation process while minimizing the loss of EUV light produced by the plasma.

One disadvantage of inspection tools operating in the EUV regime is that a particle protection device, such as a pellicle, which is commonly used in tools at longer wavelengths, cannot be used in EUV settings because the protection device is opaque at EUV wavelengths. Furthermore, the critical dimensions of the reticles intended to be inspected on a EUV tool may be so small that nearly any particle present on the reticle surface will cause unacceptable problems. By way of example, the contaminant particles may emanate from nearby optics used to direct inspection light to the reticle. In addition, the reticle stage used to move the reticle during inspection also may be a source of contaminant particles.

Furthermore, some of the optics in an EUV or other vacuum environment inspection system will need to be actuated for alignment reasons. This requires precise (e.g., sub-nanometer) accurate movement for one or more degree of freedom. In addition, some optics are large (e.g., several kilograms) and require actuation force to move. These optics are moved in vacuum. The exposed optic surface is sensitive to contamination, both from volatile organic compounds (VOCs) and from particles. The VOCs can be contaminants. The actuators required to move the optics can outgas volatile hydrocarbons. This actuation can generate particles that could land on critical surfaces within the system.

When alignment requires rotational movement of the optics, rotary seals are needed. Typical elastomeric seals (e.g., o-rings, lip seals, etc.) may be used in low vacuum applications, but they shed particles during rotation and allow gasses to enter the sealed volume, causing contamination. Ferrofluidic seals are also not suitable for ultra-high vacuum applications.

Presently, particle control in light-based reticle inspection systems is carried out with flowing air, which pushes the particles in a known direction. In vacuum systems, such as in electron beam inspect systems, particle control is done with slight amounts of positive pressure and particle reduction methods designed to reduce the number of particles in general. The previous methods have several disadvantages. For example, they have not shown a capability to eliminate particles down to 10 nm in diameter. In addition, previous methods have only been used in processes that allow reticle cleaning after inspection. However, the EUV reticle inspection tool must contend with smaller particles since no cleaning is allowed after inspection.

Differential pumping can be used to separate the vacuum environment containing an outgassing part. A differentially pumped vacuum region requires connection to pumping system. This can be difficult to achieve for a vacuum chamber within a larger assembly. In addition, the vacuum pump can create vibrations that are detrimental to precision aligned optics.

Cleaning processes can reduce the outgassing rate from components. Most actuators contain lubricants or other materials that outgas and can never be fully mitigated. In addition, during movement additional molecular and particle contaminants are generated that cannot be totally removed with cleaning.

Therefore, improved systems and methods of rotary sealing in an ultra-high vacuum are needed.

BRIEF SUMMARY OF THE DISCLOSURE

An embodiment of the present disclosure provides a system. The system may comprise a vacuum chamber, a component mount disposed in the vacuum chamber, and a base. The system may further comprise a bellows disposed between the base and the component mount. The bellows, the base, and the component mount may define an actuator compartment therebetween. The bellows may provide a seal between the base and the component mount. The system may further comprise an actuator disposed in the actuator compartment. The actuator may be configured to rotate the component relative to the base. Rotation of the component mount relative to the base may cause torsional elastic deformation of the bellows.

According to an embodiment of the present disclosure, the system may further comprise a first flange secured to the base and a first end of the bellows. The first flange may be secured to the first end of the bellows by a circumferential weld. The system may further comprise a second flange secured to the component mount and a second end of the bellows. The second flange may be secured to the second end of the bellows by a circumferential weld. At least one of the first flange and the second flange may comprise a seal gland, and a sealing ring may be disposed in the seal gland.

According to an embodiment of the present disclosure, the bellows may comprise a convolute section disposed between a first end section and a second end section. The convolute section may comprise vertical ribs extending from the first end section to the second end section. The periphery of the convolute section may have a sinusoidal shape defined by the vertical ribs. The bellows may be made of a nickel-cobalt alloy. The bellows may be fabricated by electroformation. The bellows may have a substantially circular cross-section.

According to an embodiment of the present disclosure, the system may further comprise an optical component disposed on the component mount in the vacuum chamber. Rotation of the component mount relative to the base may cause corresponding rotation of the optical component.

Another embodiment of the present disclosure provides a method. The method may comprise providing a component mount in a vacuum chamber. The method may further comprise providing an actuator disposed between the component mount and a base. A bellows may be disposed between the base and the component mount. The bellows, the base, and the component mount may define an actuator compartment therebetween. The bellows may provide a seal between the base and the component mount. The method may further comprise rotating the component mount relative to the base using the actuator. Rotation of the component mount relative to the base may cause torsional elastic deformation of the bellows.

According to an embodiment of the present disclosure, the method may further comprise electroforming a bellows structure on a mandrel. The method may further comprise removing the mandrel from the bellows structure to obtain a bellows. The method may further comprise disposing the bellows between the base and the component mount in the vacuum chamber.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Figure 1:
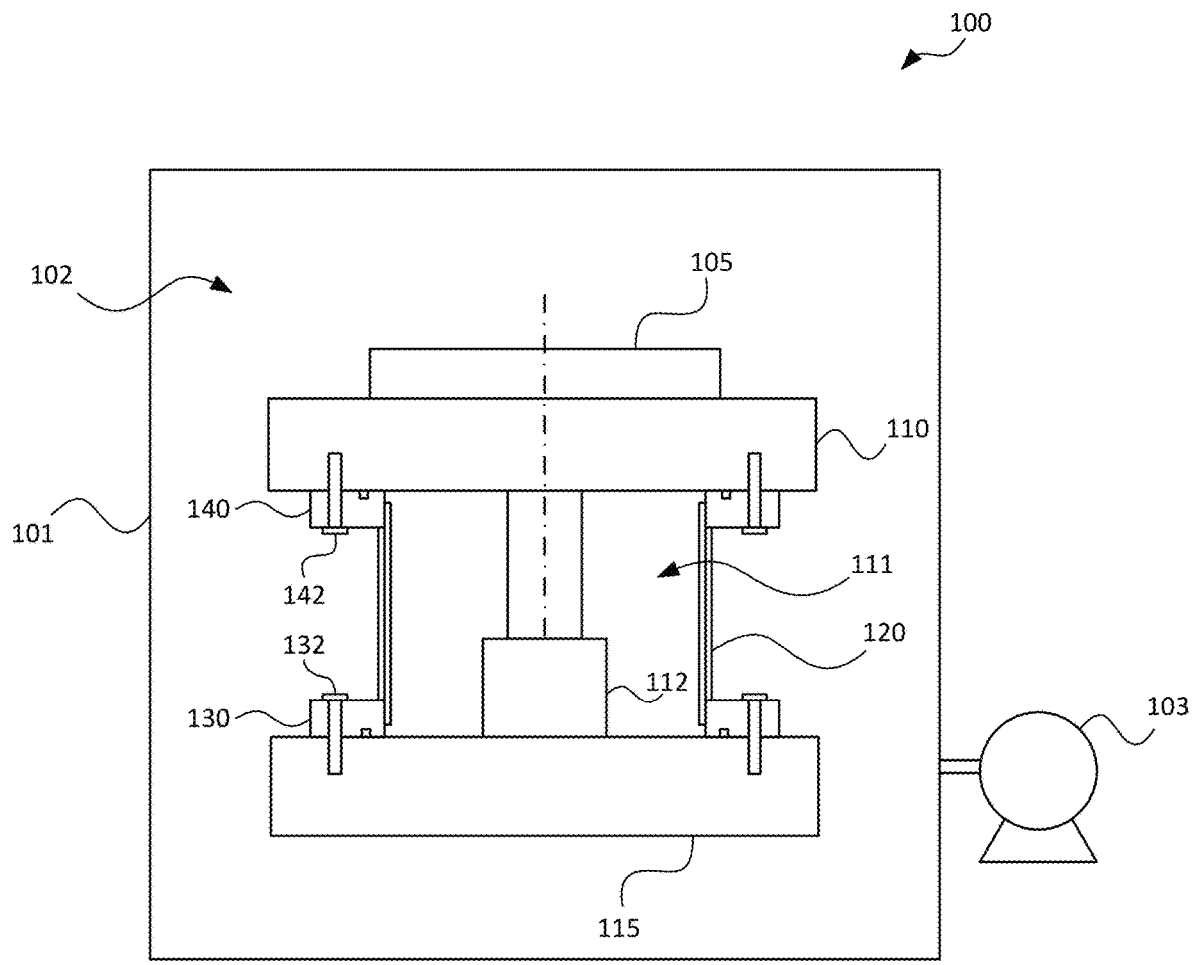
FIG. 1 is a cross-sectional diagram of a system according to an embodiment of the present disclosure.

FIG. 1 is a cross-sectional diagram of a system 100. The system 100 includes a vacuum chamber 101. In an instance, the vacuum chamber 101 is part of an EUV semiconductor inspection tool. Walls of the vacuum chamber 101 define an interior 102, which can be pumped by a vacuum pump 103 to low or vacuum pressures. The vacuum pressure may be less than $10^{-7}$ mbar. For example, the vacuum pressure may be ultra-high vacuum (UHV) levels (e.g., between $10^{-7}$ and $10^{12}$ mbar. Partial pressure for hydrocarbons may be less than $10^{-10}$ mbar.

A component 105 can be disposed inside the vacuum chamber, held by a component mount 110. The component 105 may be an optical component. The optical component can be, for example, a camera, a lens, mirror, aperture, sensor, filter, attenuator, or shutter. The optical component can be configured for use at EUV wavelengths. In another instance, the optical component may be a mask. The mask may not include a pellicle, so even one particle on the mask can mean failure during operation. The component 105 can be other components that are actuated remotely in vacuum, such as a stage. The system 100 may include a plurality of component mounts 110, each configured to hold different components 105. For example, the system 100 may include a sensor array, where each sensor is held by a separate component mount 110.

EUV light or light at other wavelengths can be directed through the component 105. There may be a light source in the vacuum chamber 101.

The component mount 110 may be connected to a base 115. A bellows 120 may be positioned between the base 115 and the component mount 110. The bellows 120 may provide a seal between the base 115 and the component mount 110. This seal may provide several orders of magnitude of protection with molecules. For example, the seal may have a leakage rate of less than $10^{-11}$ standard cubic centimeters per second, per meter of length. Nearly all particles with a size of 10 nm or larger can be contained using the bellows 120.

The bellows 120, the base 115, and the component mount 110 may define an actuator compartment 111 therebetween.

FIG. 1 is a cross-sectional view, so the bellows 120 may extend around an entirety of the base 115 and component mount 110 to seal the actuator compartment 111. The bellows 120 may be connected to the base 115 and component mount 110 using fasteners, welding, brazing, soldering, or other techniques.

In an instance, the bellows 120 are made of a nickel-cobalt alloy. Other metals may be used, such as nickel, copper, or other alloys. The bellows 120 can be any flexible material that is UHV compatible and can prevent the majority of contaminant passage. The bellows 120 may be able to withstand a pressure differential between atmospheric pressure and UHV in the vacuum chamber 101 and the actuator compartment 111. The bellows 120 may withstand greater pressure differentials, for example, as high as between 3 atm and UHV.

An actuator 112 may be positioned in the actuator compartment 111. The actuator 112 may be configured to rotate the component mount 110 relative to the base 115. The actuator 112 may have lubricant for operation, and any movement by the actuator 112 can generate particles and VOCs. The particles are typically made of the materials in or around the vacuum chamber 101. For example, two components in the vacuum chamber 101 may rub together and form particles. VOCs can be lubricants, cleaning agents, residues from a machine shop, or the materials in the vacuum chamber 101.

Thus, particles can occur due to shedding of material caused by some disturbance. The particles generally are made of the same material as the actuator 112 (e.g., metals, plastics, and lubricants). These can be shredded material from two materials rubbing together or dislodgement of loosely-adhered material (e.g., deposited particles, lubricants, etc.) caused by movement and vibration. Generally, anything that moves (e.g., actuator 112) can generate particles. In addition, even static items can generate VOCs either as the material degrades or as adhered volatile compounds evaporate through outgassing.

Lubricants generate outgas, but outgassing can come from the material itself as it breaks down. For example, plastics can outgas. Outgassing can also come from molecular contaminates adhered to otherwise clean surfaces like metal. Contaminates generally comes from residual contamination during manufacture.

A size of the particles can depend on which parts move, materials, or surface finishes. Particles may be 5 nm or larger in diameter, such as 10 nm or larger in diameter.

Rotation of the component mount 110 relative to the base 115 may cause torsional elastic deformation of the bellows 120. By twisting the bellows 120, the component mount 110 may be rotated for alignment. For example, the component mount 110 may be rotated 10 microradians or more relative to the base 115. The range of rotation of the bellows 120 within the elastic deformation range and the force required to cause torsional elastic deformation may depend on the material, thickness, and geometry of the bellows 120 and the temperature and vacuum pressures inside the vacuum chamber 101 and the actuator compartment 111. For example, the range of rotation of the bellows 120 may be 1 to 10 microradians, 1 to 3 microradians, 1.3 to 3 microradians, 1.3 to 2 microradians, 2 to 3 microradians, or other ranges. In a particular embodiment, the component mount 110 may be rotated by about 2 microradians relative to the base 115. When the deformation of the bellows 120 is in the elastic range, the bellows 120 may be restored to its original shape by rotation in the opposite direction, and rotation may be repeated. If deformation of the bellows 120 is in the inelastic range, the bellows 120 may be unable to be restored to its original shape, and such plastic deformation may break the seal of the actuator compartment 111 and may require replacement of the bellows 120.

Rotation of the component mount 110 relative to the base 115 may cause corresponding rotation of the component 105. This may allow alignment of the component 105 and improve accuracy of the measurements of the system 100.

Figure 2A:
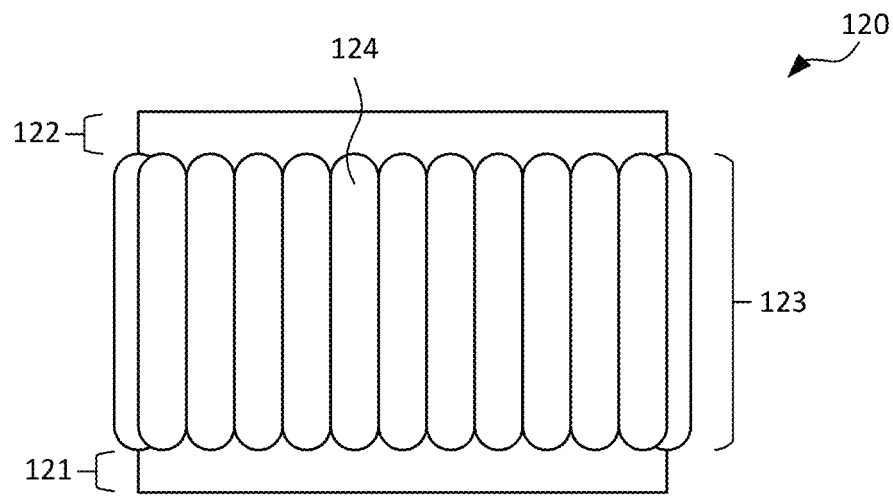
FIG. 2A is a side view of a bellows of a system according to an embodiment of the present disclosure.
Figure 2B:
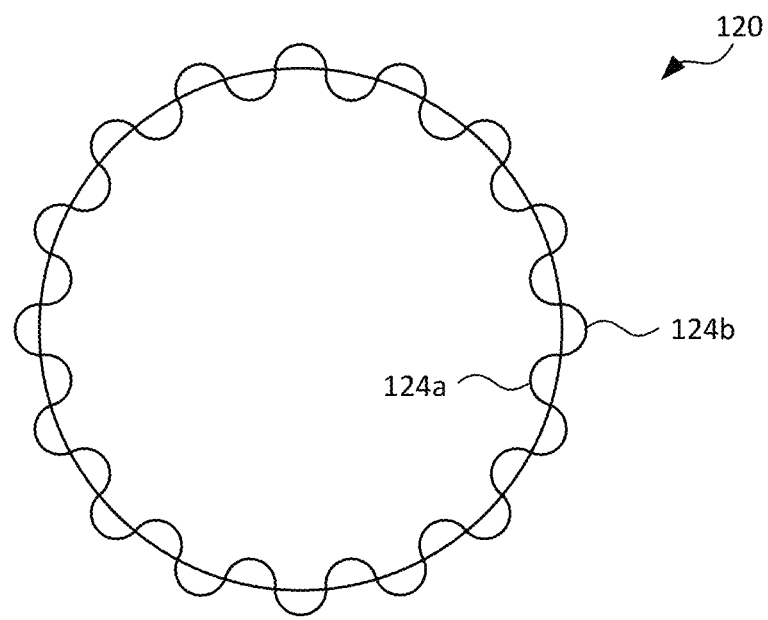
FIG. 2B is a top view of the bellows of FIG. 2A.

FIGS. 2A and 2B illustrate bellows 120. The bellows 120 may comprise a convolute section 123. The convolute section 123 may be disposed between a first end section 121 and a second end section 122 of the bellows 120. The convolute section 123 may comprise vertical ribs 124 extending from the first end section 121 to the second end section 122. As shown in FIG. 2B, the vertical ribs 124 may protrude inwardly and outwardly from the bellows 120 in an alternating manner. For example, each inwardly-protruding rib 124a may be arranged between two outwardly-protruding ribs 124b. The vertical ribs 124 may each have similar geometries. For example, each of the vertical ribs 124 may have similar length, width, protrusion depth, and shape, the values of which may depend on the pressure load and rotation required for the bellows 120. According to a particular embodiment, the vertical ribs 124 may have a length of less than 1.77 in, a width of about 0.25 in, and a protrusion depth of about 0.125 in. The vertical ribs 124 may have a semi-circular shape. In this way, the periphery of the convolute section 123 may have a sinusoidal shape defined by the vertical ribs 124. The vertical ribs 124 may have other shapes, for example, triangular, rectangular, etc.

The bellows 120 may have a substantially circular cross-section. The bellows 120 may have a diameter of about 7 in. and a height of about 1.77 in. Alternatively, the bellows 120 may have polygonal cross-section, such as a square, hexagon, etc. In such instances, vertical ribs 124 may have differing geometries, for example, in the corners of the cross-sectional shape. The bellows 120 may have a thickness of about 0.008 in. Smaller thicknesses can be achieved by combining different layers of metals. For example, a copper layer used in combination with nickel/cobalt layers may produce a bellows 120 having a thickness of 0.003 in. The dimensions of the bellows 120 may depend on the pressure load and the rotation required.

In general, the design of the bellows 120 may depend on system requirements including rotation range, pressure/vacuum requirements, geometry constraints, and actuation force. The design of the bellows 120 may also depend on physical constraints including material properties and manufacturing capabilities. Based on a balancing of the system requirements and physical constraints, particular values for each design variable may be selected. Design variables may include geometry of the bellows (diameter, height, etc.), geometry of the convolute section (height, radius, etc.), and convolute thickness. In this way, the bellows 120 may be used in a variety of applications.

The bellows 120 may provide several advantages to the system 100 compared to existing rotary seals. The bellows 120 may be UHV compatible, and may be used in environments subject to harsh radiation, chemical, or thermal conditions. The bellows 120 can be aggressively cleaned and can be backed to high temperatures, for example, greater than 400° C. The bellows 120 may not shed particles or outgas. The bellows 120 may be configured to support greater than 1 atmosphere of pressure internally and externally. The size of the bellows 120 may be scaled larger or smaller for use in inspection systems and applications having various sizes.

The bellows 120 may be formed using various manufacturing methods. According to an embodiment of the present disclosure, the bellows 120 may be fabricated by electroformation. In an exemplary electroformation process shown in FIG. 3A, a solid metal source and a conductive mandrel are disposed in an electrolyte containing salts of the metal being electroformed, and a direct current is applied to the metal source (anode) and the mandrel (cathode). The direct current causes deposition of the metal onto the outer surface of the mandrel until a bellows structure having the required thickness is achieved. The outer surface of the mandrel has vertical ribs which correspond to the vertical ribs 124 of the bellows 120, so that when metal is deposited on the outer surface of the mandrel, the resulting bellows structure has the same vertical ribs. The mandrel may be separated intact, melted away, or chemically dissolved/etched from the bellows structure to obtain the bellows 120.

According to another embodiment of the present disclosure, the bellows 120 may be fabricated by a roll forming process. In an exemplary roll forming process shown in FIG. 3B, a metal sheet is passed through one or more sets of rollers, which form vertical ribs in the metal sheet. The metal sheet is then rolled into a cylindrical shape and welded to obtain the bellows 120.

According to another embodiment of the present disclosure, the bellows 120 may be fabricated by a hydroforming process. In an exemplary hydroforming process shown in FIG. 3C, a thin-walled tube is placed in a two-part mold. The inner surface of the two-part mold has vertical ribs which correspond to the vertical ribs 124 of the bellows 120. When a fluid is forced into the tube, the fluid pressure causes the tube to deform to the shape of the inner surface of the mold to obtain the bellows 120. The fluid may be water, oil, or other liquids.

It should be understood that the bellows 120 may be formed using other manufacturing methods known in the art, and the present disclosure is not limited to the examples described herein. With these manufacturing methods, a monolithic, thin bellows 120 having a vertical convolute section 123 may be fabricated. When used in conjunction with the system 100, the fabricated bellows 120 may be flexible enough to elastically deform when a torsional force is applied by rotation of the actuator 112, and may be strong enough to withstand pressure differential between the vacuum chamber 101 and the actuator compartment 111.

Figure 4A:
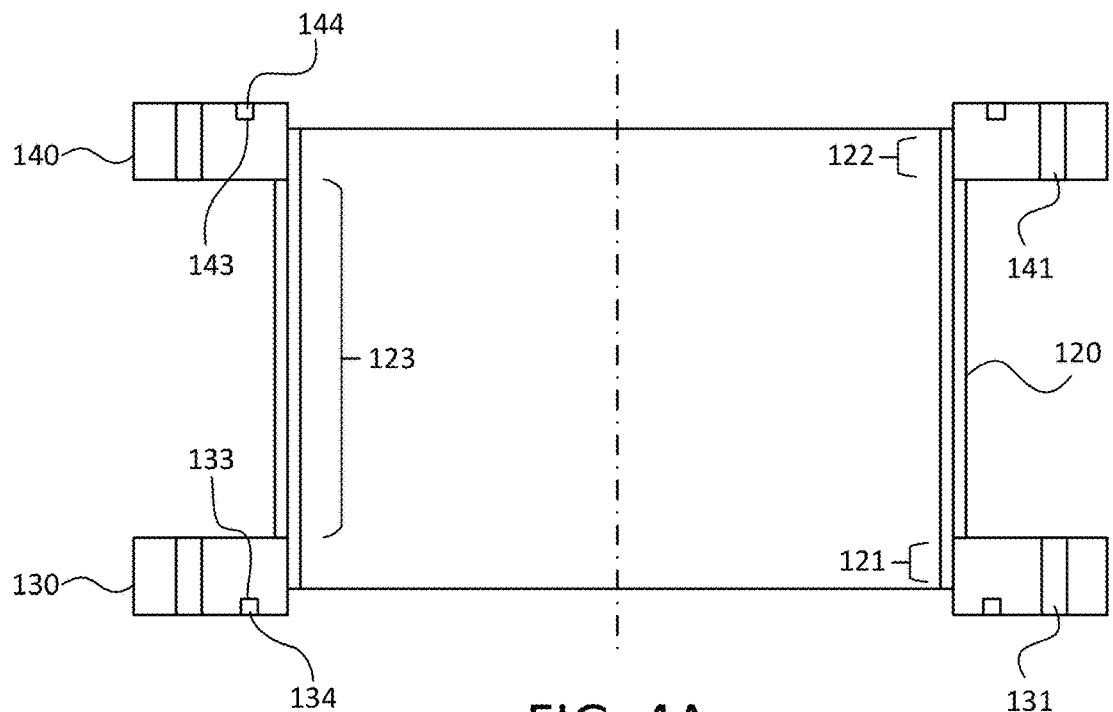
FIG. 4A is a cross-sectional diagram of a portion of the system of FIG. 1.
Figure 4B:
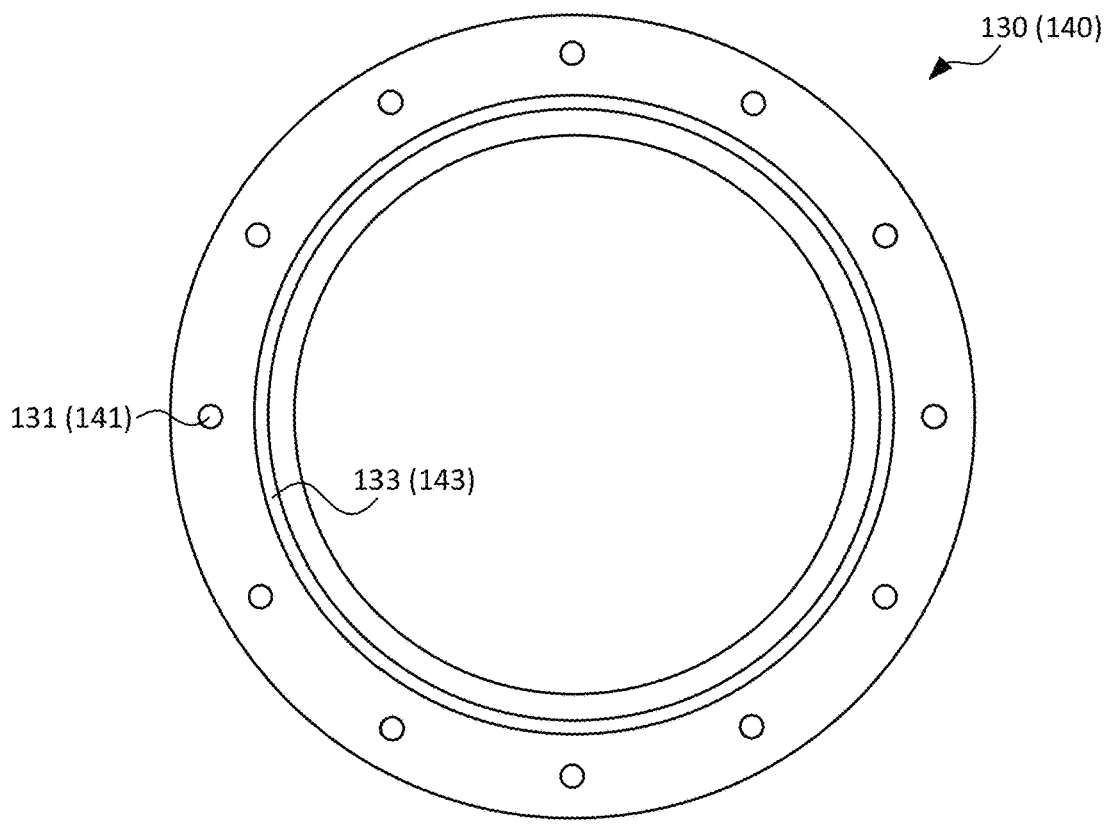
FIG. 4B is a top view of a flange of a system according to an embodiment of the present disclosure.

Referring back to FIG. 1, the system 100 may further comprise a first flange 130. The first flange 130 may be secured to the base 115 and to the first end section 121 of the bellows 120. The first flange 130 may be secured to the base 115 by fasteners and/or welds. For example, as shown in FIGS. 4A and 4B, the first flange 130 may have a plurality of first mounting holes 131 which are configured to receive first fasteners 132 to secure the first flange 130 to the base 115. The first flange 130 may also have a first seal gland 133 which is configured to receive a first sealing ring 134. The first sealing ring 134 may be made of metal. The first sealing ring 134 may provide a seal between the first flange 130 and the base 115.

The first flange 130 may be secured to the first end section 121 of the bellows 120 by a circumferential weld. For example, at least a portion of the first end section 121 of the bellows 120 may be received within an inner diameter of the first flange 130, such that an outer surface of the first end section 121 of the bellows 120 is welded to an inner surface of the first flange 130.

Referring back to FIG. 1, the system 100 may further comprise a second flange 140. The second flange 140 may be secured to the component mount 110 and to the second end section 122 of the bellows 120. The second flange 140 may be secured to the component mount 110 by fasteners and/or welds. For example, as shown in FIGS. 4A and 4B, the second flange 140 may have a plurality of second mounting holes 141 which are configured to receive second fasteners 142 to secure the second flange 140 to the component mount 110. The second flange 140 may also have a second seal gland 143 which is configured to receive a second sealing ring 144. The second sealing ring 144 may be made of metal. The second sealing ring 144 may provide a seal between the second flange 140 and the component mount 110.

The second flange 140 may be secured to the second end section 122 of the bellows 120 by a circumferential weld. For example, at least a portion of the second end section 122 of the bellows 120 may be received within an inner diameter of the second flange 140, such that an outer surface of the second end section 122 of the bellows 120 is welded to an inner surface of the second flange 140.

The first flange 130 and the second flange 140 may be made of metal. For example, the first flange 130 and the second flange 140 may be made of 316 stainless steel. In this way, the assembly of the bellows 120, the first flange 130, and the second flange 140 may result in an all-metallic rotary seal assembly.

The first flange 130 and the second flange 140 may be configured for a variety of seals. Geometry of the first sealing gland 133 and the second sealing gland 143 may depend on the type of seals used. The first sealing ring 134 and the second sealing ring 144 may be flexible metal seals, conflat seals, wire seals, indium seals, etc. A flexible metal seal may comprise a close wound helical spring surrounded by one or more metal jackets. During compression, the spring may force the jacket to yield and ensure positive contact with the sealing faces. Conflat seals are compressed by knife edges in the first sealing gland 133 and the second sealing gland 143 to create a seal.

With the system 100, the bellows 120 may provide a hermetic seal between the base 115 and the component mount 110, such that components 105 within the vacuum chamber 101 may be separated from particles and VOCs generated by the actuator 112 in the actuator compartment 111, and the bellows 120 may be able to endure torsional elastic deformation to allow rotation of the component mount 110 relative to the base 115 for in-situ alignment of the component 105. In this way, the system 100 may provide a cleaner inspection environment and improve system accuracy.

Figure 5A:
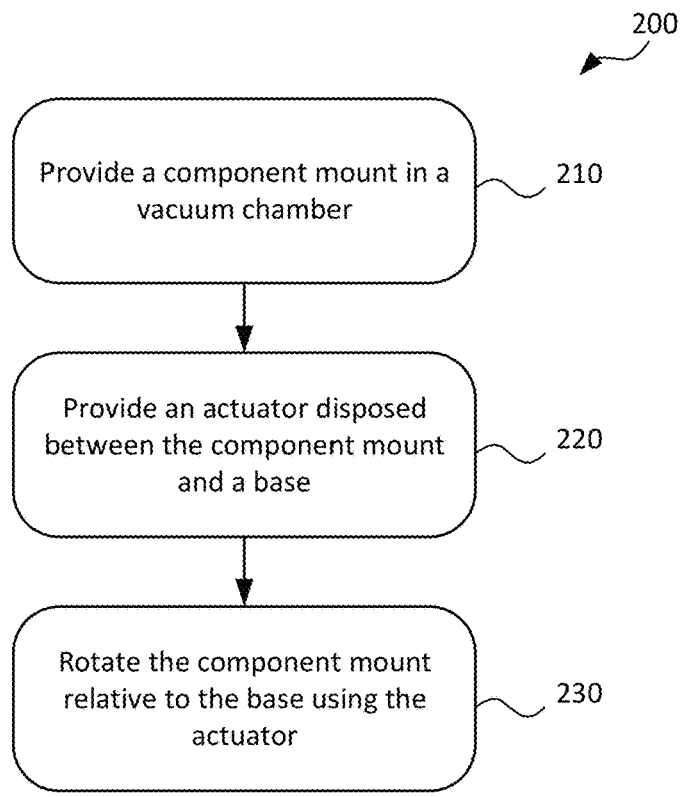
FIG. 5A is a flowchart of a method according to an embodiment of the present disclosure.

FIG. 5A is a flowchart of a method 200 according to an embodiment of the present disclosure. The method 200 can be used in a system, such as the system 100. The method 200 may include the following steps.

At step 210, a component mount is provided in a vacuum chamber. The vacuum chamber may be pumped by a vacuum pump to low or vacuum pressures, such as UHV. The component mount may hold a component. The component may be an optical component or other components that may be actuated remotely in vacuum.

At step 220, an actuator is provided, disposed between the component mount and a base. A bellows is disposed between the base and the component mount, where the bellows, the base, and the component mount define an actuator compartment therebetween. The bellows may provide a seal between the base and the component mount. The actuator compartment may be pumped by a vacuum pump to low or vacuum pressures.

At step 230, the component mount is rotated relative to the base using the actuator. Rotation of the component mount relative to the base causes torsional elastic deformation of the bellows. By twisting the bellows using the actuator, the component mount (and the component disposed thereon) may be rotated for alignment, and may improve accuracy of measurements. For example, the component mount may be rotated 10 microradians or more relative to the base. The range of rotation of the bellows within the elastic deformation range and the force required to cause torsional elastic deformation may depend on the material, thickness, and geometry of the bellows and the vacuum pressures inside the vacuum chamber and the actuator compartment. For example, the range of rotation of the bellows may be 1 to 10 microradians, 1 to 3 microradians, 1.3 to 3 microradians, 1.3 to 2 microradians, 2 to 3 microradians, or other ranges. Because the deformation of the bellows is in the elastic range, the bellows may be restored to its original shape by rotation in the opposite direction, and rotation may be repeated. If deformation of the bellows is in the inelastic range, the bellows may be unable to be restored to its original shape, and such plastic deformation may break the seal of the actuator compartment and may require replacement of the bellows.

With the method 200, the bellows may provide a hermetic seal between the base and the component mount, such that components within the vacuum chamber may be separated from particles and VOCs generated by the actuator in the actuator compartment, and the bellows may be able to endure torsional elastic deformation to allow rotation of the component mount relative to the base for in-situ alignment of the component. In this way, the method 200 may improve measurement accuracy.

Figure 5B:
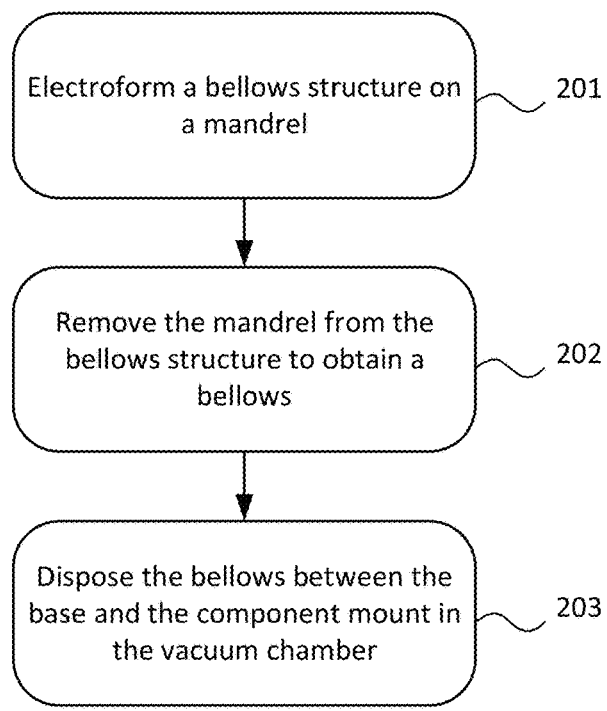
FIG. 5B is a flowchart of another method according to an embodiment of the present disclosure.

According to an embodiment of the present disclosure, the method 200 may further comprise the following steps to manufacture the bellows shown in FIG. 5B.

Figure 3A:
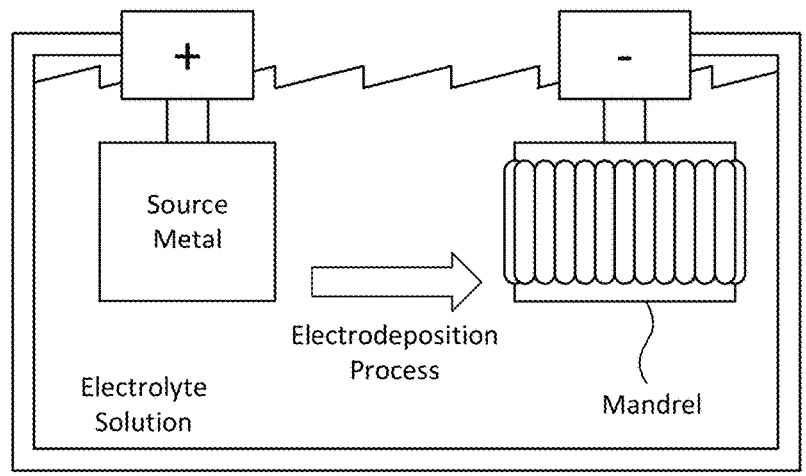
FIG. 3A is an exemplary electroformation process according to an embodiment of the present disclosure.
Figure 3B:
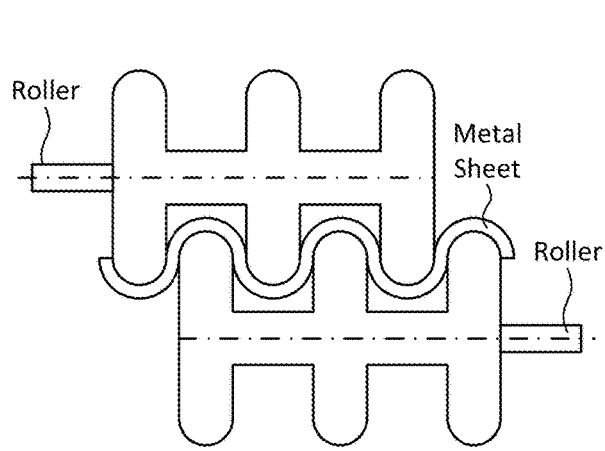
FIG. 3B is an exemplary roll forming process according to an embodiment of the present disclosure.
Figure 3C:
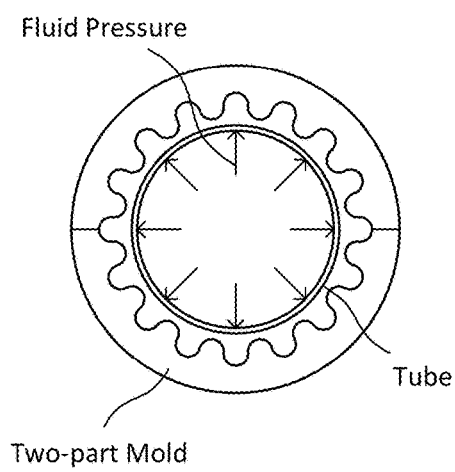
FIG. 3C is an exemplary hydroforming process according to an embodiment of the present disclosure.

At step 201, a bellows structure is electroformed on a mandrel. An exemplary electroformation process is shown in FIG. 3A, in which a solid metal source and a conductive mandrel are disposed in an electrolyte containing salts of the metal being electroformed, and a direct current is applied to the metal source (anode) and the mandrel (cathode). The direct current causes deposition of the metal onto the outer surface of the mandrel until a bellows structure having the required thickness is achieved. The outer surface of the mandrel has vertical ribs which correspond to the vertical ribs of the bellows, so that when metal is deposited on the outer surface of the mandrel, the resulting bellows structure has the same vertical ribs.

At step 202, the mandrel is removed from the bellows structure to obtain the bellows. The mandrel may be separated intact, melted away, or chemically dissolved/etched to obtain the bellows.

At step 203, the bellows are disposed between the base and the component mount in the vacuum chamber. For example, the bellows may be secured to the base and the component mount via fasteners or welds.

Steps 201 to 203 may be performed prior to step 210, prior to step 220, and/or prior to step 230 of the method 200.

With the electroformation process of steps 201 to 203, a monolithic, thin bellows having a vertical convolute structure may be fabricated. When used in conjunction with the method 200, the fabricated bellows may be flexible enough to elastically deform when a torsional force is applied by rotation of the actuator, and may be strong enough to withstand pressure differential between the vacuum chamber and the actuator compartment.

While disclosed as reducing particles and contamination on the optical components, the embodiments disclosed herein also can protect the actuator from the environment outside the actuator compartment. When cleaning the area with the optical component, solvents, plasma, $O_3$, ultraviolet light, and/or $H_2$ may be used. These cleaning techniques can damage the actuator. The bellows can protect the actuator from these cleaning techniques.

While the description provided throughout the present disclosure has focused on particle control around an optical component in an EUV lithography tool, EUV metrology tool, or EUV reticle inspection tool, the embodiments disclosed herein should be interpreted to apply to any critical region of an EUV optical tool or optical tool for other light wavelengths that is sensitive to the presence of particles. Embodiments disclosed herein also can be applied to other vacuum systems that are sensitive to particles, such as electron beam systems. For example, embodiments disclosed herein can generally be used to align an aspheric optic by rotation around a beam axis.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
   a vacuum chamber;
   a component mount disposed in the vacuum chamber;
   a base;
   a bellows disposed between the base and the component mount, wherein the bellows, the base, and the component mount define an actuator compartment therebetween, wherein the bellows provides a seal between the base and the component mount; and
   an actuator disposed in the actuator compartment, wherein the actuator is configured to rotate the component mount relative to the base;
   wherein rotation of the component mount relative to the base causes torsional elastic deformation of the bellows.

2. The system of claim 1, further comprising:
   a first flange secured to the base and a first end of the bellows; and
   a second flange secured to the component mount and a second end of the bellows.

3. The system of claim 2, wherein:
   the first flange is secured to the first end of the bellows by a circumferential weld; and
   the second flange is secured to the second end of the bellows by a circumferential weld.

4. The system of claim 2, wherein at least one of the first flange and the second flange comprises a seal gland, and a sealing ring is disposed in the seal gland.

5. The system of claim 1, wherein the bellows comprises a convolute section disposed between a first end section and a second end section, and the convolute section comprises vertical ribs extending from the first end section to the second end section.

6. The system of claim 5, wherein the periphery of the convolute section has a sinusoidal shape defined by the vertical ribs.

7. The system of claim 1, wherein the bellows is made of a nickel-cobalt alloy.

8. The system of claim 1, wherein the bellows is fabricated by electroformation.

9. The system of claim 1, wherein the bellows has a substantially circular cross-section.

10. The system of claim 1, further comprising:
an optical component disposed on the component mount in the vacuum chamber;
wherein rotation of the component mount relative to the base causes corresponding rotation of the optical component.

11. A method comprising:
providing a component mount in a vacuum chamber;
providing an actuator disposed between the component mount and a base, wherein a bellows is disposed between the base and the component mount, wherein the bellows, the base, and the component mount define an actuator compartment therebetween, and wherein the bellows provides a seal between the base and the component mount; and
rotating the component mount relative to the base using the actuator, wherein rotation of the component mount relative to the base causes torsional elastic deformation of the bellows.

12. The method of claim 11, wherein:
a first flange is secured to the base and a first end of the bellows; and
a second flange is secured to the component mount and a second end of the bellows.

13. The method of claim 12, wherein:
the first flange is secured to the first end of the bellows by a circumferential weld; and
the second flange is secured to the second end of the bellows by a circumferential weld.

14. The method of claim 12, wherein at least one of the first flange and the second flange comprises a seal gland, and a sealing ring is disposed in the seal gland.

15. The method of claim 11, wherein the bellows comprises a convolute section disposed between a first end section and a second end section, and the convolute section comprises vertical ribs extending from the first end section to the second end section.

16. The method of claim 15, wherein the periphery of the convolute section has a sinusoidal shape defined by the vertical ribs.

17. The method of claim 11, wherein the bellows is made of a nickel-cobalt alloy.

18. The method of claim 11, wherein the method further comprises:
electroforming a bellows structure on a mandrel;
removing the mandrel from the bellows structure to obtain the bellows; and
disposing the bellows between the base and the component mount in the vacuum chamber.

19. The method of claim 11, wherein the bellows has a substantially circular cross-section.

20. The method of claim 11, wherein an optical component is disposed on the component mount in the vacuum chamber, and rotation of the component mount relative to the base causes corresponding rotation of the optical component.

* * * * *